United States Patent [19]

Zell

[11] Patent Number: 5,229,924
[45] Date of Patent: Jul. 20, 1993

[54] CABINET FOR THE ACCEPTANCE OF ELECTRICAL CARD CAGES

[75] Inventor: Karl Zell, Niederpoecking, Fed. Rep. of Germany

[73] Assignee: Siemens Aktiengesellschaft, Munich, Fed. Rep. of Germany

[21] Appl. No.: 743,234

[22] Filed: Aug. 9, 1991

[30] Foreign Application Priority Data

Aug. 21, 1990 [DE] Fed. Rep. of Germany ....... 9012049

[51] Int. Cl.⁵ .............................................. H05K 7/14
[52] U.S. Cl. .................................. 361/415; 361/393; 361/399; 361/413; 174/35 MS; 165/76
[58] Field of Search ............... 361/390, 392, 393, 394, 361/399, 383, 386, 413, 415, 424, 428, 429; 174/35 R, 35 MS; 165/104, 33, 76

[56] References Cited

U.S. PATENT DOCUMENTS

| | | | |
|---|---|---|---|
| 4,359,085 | 11/1982 | Mueller | 165/47 |
| 4,386,651 | 6/1983 | Reinhard | 165/104.33 |
| 4,477,862 | 10/1984 | Gonzales | 361/393 |
| 4,555,744 | 11/1985 | Maroney et al. | 361/212 |
| 4,967,311 | 10/1990 | Feychau et al. | 361/395 |

FOREIGN PATENT DOCUMENTS 2842060 4/1980 Fed. Rep. of Germany.

*Primary Examiner*—Leo P. Picard
*Assistant Examiner*—Young S. Whang
*Attorney, Agent, or Firm*—Hill, Steadman & Simpson

[57] ABSTRACT

A cabinet system is provided formed of one or more individual electrical card cages. Each card cage contains a back wall covering as well as a redesigned lateral part instead of a standard lateral part for fastening in a cabinet. The redesigned lateral part is designed as an outside wall and permits a stacking of the card cages above one another. The stack is completed so as to form an overall cabinet assembly by providing a bottom part and a top part.

14 Claims, 2 Drawing Sheets

CABINET FOR THE ACCEPTANCE OF ELECTRICAL CARD CAGES

BACKGROUND OF THE INVENTION

The invention is directed to a cabinet for the acceptance of a plurality of electrical card cages having different assemblies therein which are respectively connected within a card cage via backplane plug strips as well as a wiring backplane, and which are connected to the card cages via plug cables. Assemblies having different widths can be introduced within the card cages.

Such a cabinet is disclosed, for example, by German Published Application 28 42 060, incorporated herein. In this cabinet, the card cages are arranged within a cabinet rack which is composed of vertical, lateral rack bars as well as of horizontal, upper and lower rack bars. The disadvantage of this known cabinet is that a cabinet rack of a defined size must be prefabricated, even when it is not fully equipped. In this known cabinet, therefore, unnecessarily large prefabrications must usually be carried out due to the prescription of a defined cabinet size.

German Utility Model 85 09 591 discloses a cabinet that can be adapted to different equipping desires that arise. For that purpose, this cabinet is composed of a plurality of individual, independent, stackable card cages. What is disadvantageous about this cabinet is that lateral parts, back walls, and doors that differ in size must be employed, dependent on the number of card cages which are employed and stacked above one another.

SUMMARY OF THE INVENTION

It is an object of the present invention to specify a cabinet of the type initially cited which offers an even greater flexibility without any, and all prefabrications upon construction with respect to the different size categories that are required.

In a cabinet of the above-recited type, this object is inventively achieved in that the cabinet is composed of one or more stackable card cages as well as of a bottom part and of a top part. The individual card cages comprise lateral parts and a back wall covering designed as an outside wall. The lateral parts have their lower edges provided with male projecting members and have their upper edges provided with corresponding receiving openings which coincide with the projecting members in terms of contour and are arranged in alignment with the projecting members.

The advantage of the cabinet of the invention is that prefabrications have to be carried out only for the desired size of the cabinet and that the cabinet ca subsequently be arbitrarily expanded as desired without specific parts which were previously employed and have to be taken out of service. As a result of the allocation of the paneling parts to the individual, stackable card cages, thus unnecessary prefabrications are avoided given greater flexibility in the production of the cabinets. The front side of the cabinet is thus formed by the panels of the individual assemblies or by corresponding cover panels.

An expedient development of the cabinet of the invention is that the back wall covering is attached at a distance from the transverse bars of the card cages. The cabling of the cabinet can thus occur within the cabinet space.

Another expedient development of the cabinet of the invention is that the bottom part and/or top part contains aerators. As a result thereof, adequate aeration of the individual assemblies or panels can be managed in any stage of expansion of the cabinet of the invention.

DESCRIPTION OF THE PREFERRED EMBODIMENTS

Figure 1:
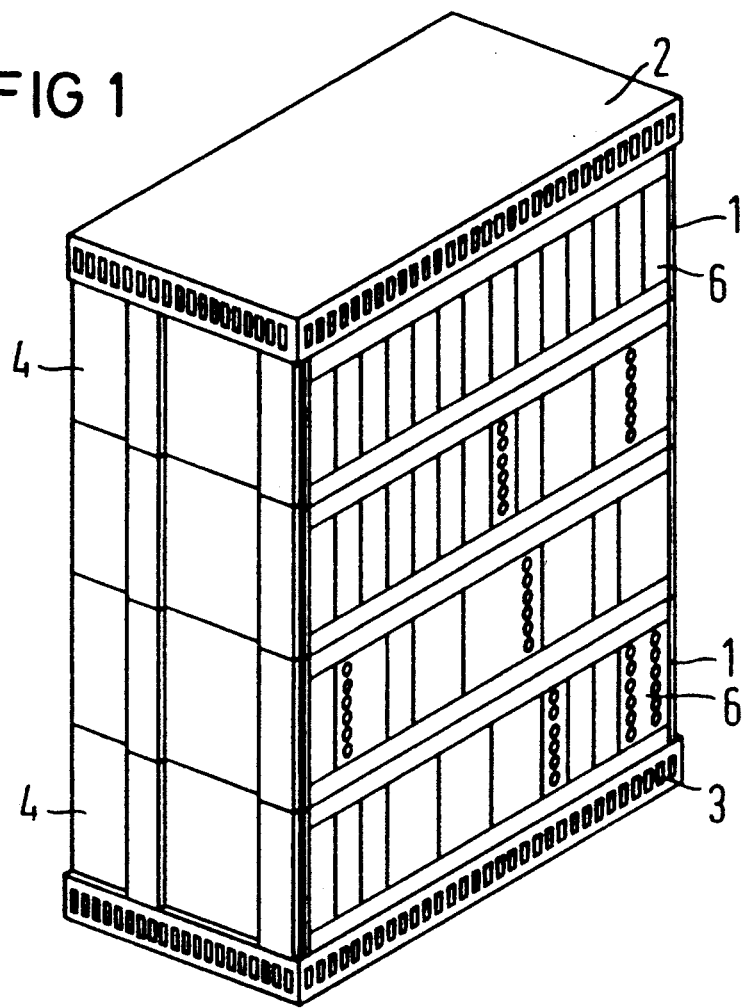
FIG. 1 is a perspective view of a cabinet of the present invention having four card cages stacked above one another and also having a top part and a bottom part.
Figure 2:
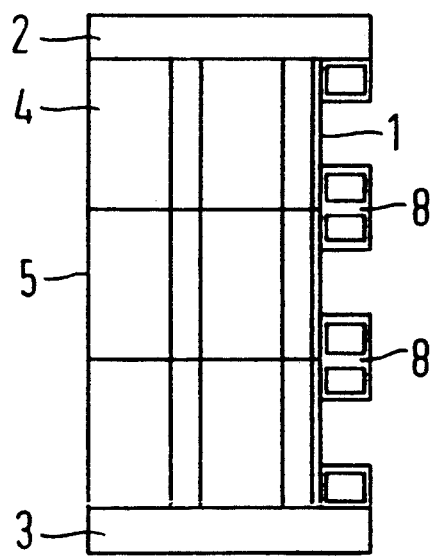
FIG. 2 is a side view of a cabinet of the present invention having three card cages arranged above one another and having a top part as well as a bottom part.

The overall view of a cabinet which is constructed in accordance with the present invention results from FIGS. 1 and 2. The cabinet is essentially composed of card cages 1 stacked on top of one another. Each of the card cages contains a plurality of assemblies. The group of card cages is terminated by a top part 2 and by a bottom part 3. The individual card cages are limited by lateral parts 4 and back wall coverings 5. Assembly panels 6 form the front termination, these assembly panels 6 being differently designed depending on the size of the assemblies with which they are associated; and depending on the job of the assemblies. Furthermore, the individual card cages 1 can be provided with cover panels 8 at the top and bottom of the front side behind which assembly fuse links to prevent unauthorized plugging and pulling of the individual assemblies are situated.

Aerators can be integrated within the bottom parts 3 or within the top parts 2 for better heat dissipation.

Figure 3:
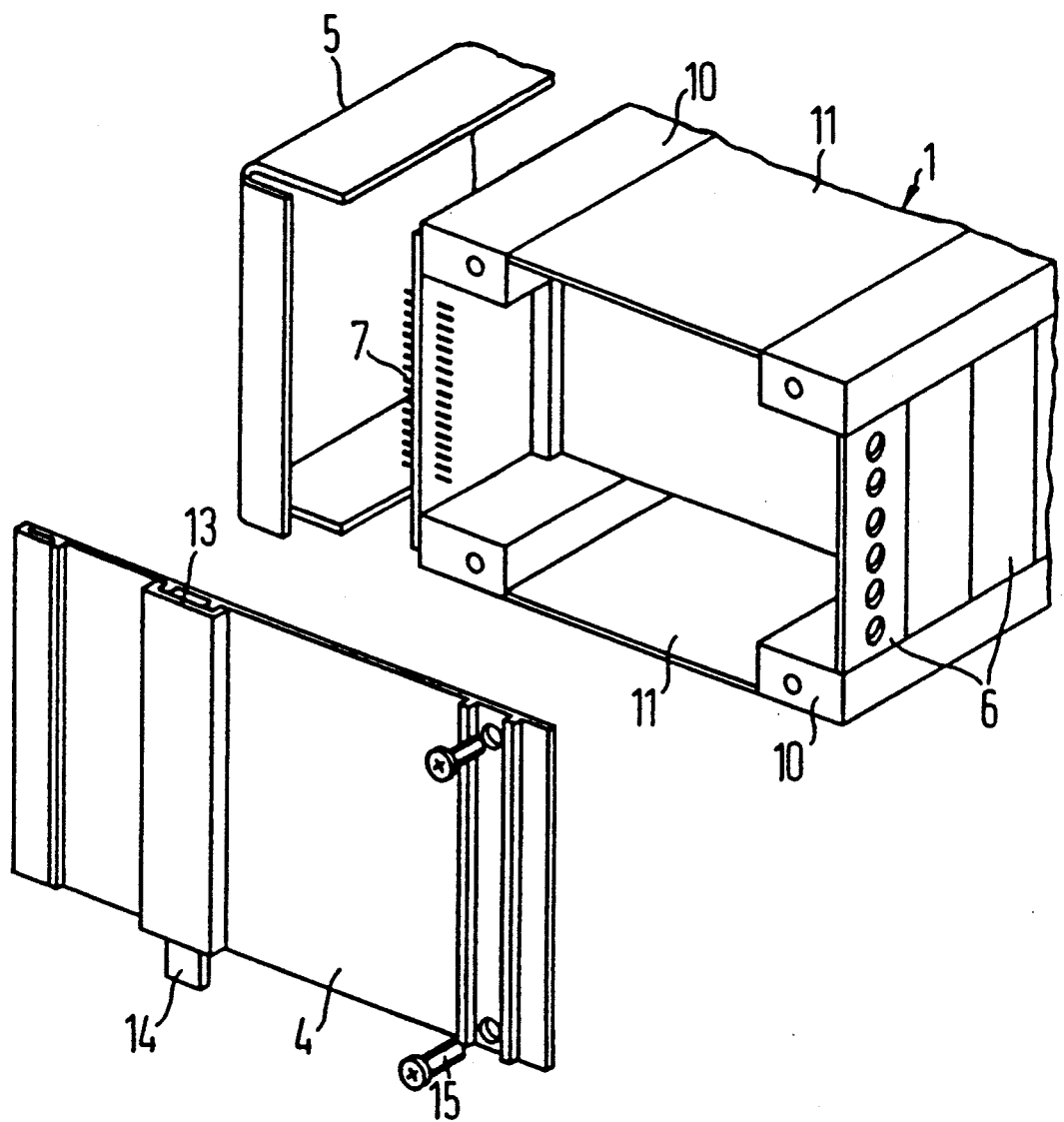
FIG. 3 is a perspective partial view of a module frame of a cabinet of the present invention.

FIG. 3 shows details of card cages 1 of a cabinet of the invention. The card cage 1 is essentially composed of the two lateral parts 4 which are connected to one another by transverse bars 10. Different assemblies having different assembly panels 6 can be inserted between the upper and lower transverse bar 10 of a card cage 1. These assemblies are contacted to a wiring backplane 7 with plug connectors. The lateral parts that simultaneously serve as cabinet paneling comprise male projection members 14 at their lower edges which engage into corresponding receiving openings 13 that are arranged at their upper edges and which coincide with the projections in terms of contour and are arranged in alignment therewith. An exact stacking of the card cages is thus enabled. The possibility thus arises of masking the projections and the corresponding receiving openings 13 as well as the screws 15 that serve the purpose of fastening the lateral parts 4 to the transverse bars 10 with a screw covering in an aesthetic way. The back wall covering 5 of the individual card cage 1 is attached at a distance from the wiring backplane 7 of the card cage 1. A wiring of the assemblies as well as of the card cages to one another within the closed cabinet is possible in this way.

The individual card cages 1 are shielded at the top and bottom with shielding plates 11. In order to achieve a 100% shielding, the assembly panels 6, the lateral parts 4, as well as the back wall covering 5, are integrated into the shielding concept.

Although various minor changes and modifications might be proposed by those skilled in the art, it will be understood that I wish to include within the claims of the patent warranted hereon all such changes and modifications as reasonably come within my contribution to the art.

I claim as my invention:

1. The cabinet assembly, comprising:
 a plurality of electrical card cages with each card cage containing a plurality of assemblies therein;
 each card cage having opposed lateral side parts and a wiring backplane at a back of the card cage;
 each of the assemblies in the card cages having an associated assembly panel positioned at a front of the respective card cage;
 electrical connection means for connecting the assembly panels in each card cage to the wiring backplane;
 the lateral side parts of each of the card cages forming outside side walls of the cabinet assembly, and the assembly panels forming a front outside wall of the cabinet assembly;
 the electrical card cages being stacked on to of one another and having a top part at a top of the stack and a bottom part at a bottom of the stack; and
 the lateral parts of each card cage having a lower edge provided with a male projection member and an upper edge provided with corresponding receiving openings which coincide with the male projection members in terms of contour and which are arranged in alignment with the male projection members so as to retain the electrical card cages in stacked vertical relationship.

2. The cabinet assembly according to claim 1 wherein each card cage has a back wall covering parallel to the wiring backplane and covering the wiring backplane, the back wall coverings of the card cages forming an outside back wall of the cabinet assembly.

3. The cabinet according to claim 1 further comprising electrical cables connecting the card cages of the cabinet assembly to one another via respective wiring backplanes of the card cages.

4. The cabinet assembly according to claim 1 wherein at least two of the assemblies within at least one of the card cages have differing words.

5. The cabinet assembly according to claim 1 wherein a back wall covering is provided on each of the cages and is attached at a distance from transverse bars in each card cage connecting the lateral parts.

6. The cabinet assembly according to claim 1 wherein each card cage contains four transverse bars, two of the transverse bars at a rear of each card cage connecting to the wiring backplane and two of the transverse bars at a front of each card cage having the assembly panels positioned therebetween.

7. The cabinet assembly according to claim 1 wherein each card cage has four transverse bars with two at a front and two at a back of each card cage and wherein the lateral side parts are mounted to the transverse bars.

8. The cabinet assembly according to claim 1 wherein top and bottom shielding plates are provided for each card cage between the front assembly panels and the wiring backplane.

9. The cabinet assembly according to claim 1 wherein the bottom part contains aerators.

10. The cabinet assembly according to claim 1 wherein the top part contains aerators.

11. The cabinet assembly according to claim 1 wherein at least two of the assembly panels in at least one of the card cages differ from one another.

12. The cabinet assembly according to claim 11 wherein a width of at least two of the assembly panels in at least one of the card cages differ with respect to each other.

13. A cabinet assembly, comprising:
 a plurality of electrical card cages with each card cage containing a plurality of assemblies therein;
 each card cage having opposed lateral side parts and a wiring backplane at a back of the card cage;
 each of the assemblies in the card cages having an associated assembly panel positioned at a front of the respective card cage;
 electrical connection means for connecting the assembly panels in each card cage to the wiring backplane;
 the lateral side parts of each of the card cages forming outside side walls of the cabinet assembly, and the assembly panels forming a front outside wall of the cabinet assembly;
 the electrical card cages being vertically stacked on top of one another; and
 the lateral parts of each card cage having a lower edge provided with a first mating and alignment member and an upper edge provided with a corresponding second mating and alignment member in vertical alignment with the first member such that when the card cages are stacked in vertical relationship, the first and second members mate and retain the cages on top of one another.

14. A cabinet assembly according to claim 13 wherein a top part is positioned at a top of the stack and a bottom part is positioned at a bottom of the stack.

* * * * *